United States Patent
Williams et al.

(10) Patent No.: US 6,421,033 B1
(45) Date of Patent: Jul. 16, 2002

(54) CURRENT-DRIVEN EMISSIVE DISPLAY ADDRESSING AND FABRICATION SCHEME

(75) Inventors: George M. Williams; Bruce K. Winker, both of Thousand Oaks, CA (US); Zhiming Zhuang, Wheeling, IL (US)

(73) Assignee: Innovative Technology Licensing, LLC, Thousand Oaks, CA (US)

(*) Notice: Subject to any disclaimer, the term of this patent is extended or adjusted under 35 U.S.C. 154(b) by 0 days.

(21) Appl. No.: 09/527,147

(22) Filed: Mar. 16, 2000

Related U.S. Application Data (63) Continuation-in-part of application No. 09/408,746, filed on Sep. 30, 1999.

(51) Int. Cl.[7] ............................. G09G 3/20; G09G 3/36
(52) U.S. Cl. ............................. 345/55; 345/98; 345/103
(58) Field of Search ............................. 345/33, 36, 38, 345/39, 55, 87, 90, 100, 92, 98, 103; 315/169.3

(56) References Cited

U.S. PATENT DOCUMENTS

| | | | | |
|---|---|---|---|---|
| 4,982,275 A | * | 1/1991 | Brody ........................ | 358/59 |
| 5,019,807 A | | 5/1991 | Stapleton et al. ........... | 340/718 |
| 5,194,974 A | * | 3/1993 | Hamada et al. ............. | 359/59 |
| 5,525,867 A | | 6/1996 | Williams ................. | 315/169.3 |
| 5,805,122 A | * | 9/1998 | Bongaerts et al. ........... | 345/60 |
| 5,898,416 A | * | 4/1999 | Kuijk et al. .................. | 345/90 |
| 6,140,765 A | | 10/2000 | Kim et al. .................. | 313/506 |
| 6,177,921 B1 | | 1/2001 | Comiskey et al. ........... | 345/107 |
| 6,313,817 B2 | * | 11/2001 | Kuijk .......................... | 345/87 |

FOREIGN PATENT DOCUMENTS

| | | |
|---|---|---|
| EP | 0762374 | 7/1996 |

OTHER PUBLICATIONS

Journal of the SID, "Combining passive–and active–matrix addressing of LCDs", (Apr. 1, 1996), pp.9–17.*

Journal of the SID, Combining Passive–and Active–Matrix Addressing of LCDs, (Apr. 1, 1996), pp. 9–17.

* cited by examiner

Primary Examiner—Bipin Shalwala
Assistant Examiner—Jeff Piziali
(74) Attorney, Agent, or Firm—Koppel, Jacobs, Patrick & Heybl (57) ABSTRACT

An addressing scheme for use with current-driven emissive displays requires that an N-row by M-column array of pixels be divided into K segments of N/K rows each. One transistor-controlled current driver is provided for each column of pixels within a segment, and all of a segment's current drivers are connected to a respective gate address line. The array is addressed by dividing a frame time into N/K "sub-frame" times. During the first sub-frame time, the current drivers of each segment are turned on in sequence, and the first row of each segment addressed. The remaining rows are addressed in this manner during subsequent sub-frame times. The segmenting and addressing scheme reduces the duty ratio required to drive the array by a factor of K, and reduces the number of transistors required to drive the array by a factor of N/K, when compared with comparably-sized passive matrix and active matrix displays, respectively. Fabrication of the display, and other non-passive matrix displays, is simplified by placing all active components on the back side of the display panel, or on a separate printed-circuit board (PCB) which is interconnected with the pixel array via respective surface bonding pads to form a display. Fabrication is further simplified by combining the current drivers and other drive electronics into application-specific integrated circuits (ASICs).

20 Claims, 6 Drawing Sheets

CURRENT-DRIVEN EMISSIVE DISPLAY ADDRESSING AND FABRICATION SCHEME

CROSS-REFERENCE TO RELATED APPLICATIONS

This application is a continuation-in-part of application Ser. No. 09/408,746, filed Sep. 30, 1999.

BACKGROUND OF THE INVENTION

1. Field of the Invention

This invention relates to the field of current-driven emissive displays, and particularly to addressing and fabrication schemes suitable for use with such displays.

2. Description of the Related Art

A flat panel display is formed from an array of pixels arranged into rows and columns. Many technologies have been and continue to be explored in an effort to provide displays that offer high resolution, good panel brightness, and high reliability.

One approach that has shown promise involves the use of "organic emissive devices" (OEDs). An OED pixel is formed by sandwiching an organic material between row and column address lines. An OED pixel is a current-driven device, having a brightness which varies directly and nearly instantaneously with its drive current. In contrast, liquid crystal device (LCD) pixels are voltage-driven devices, which respond comparatively slowly to the rms voltage applied across them.

Modern displays are typically required to provide a high information content, which requires the display to employ a large number of rows—typically in excess of 1000—to provide the necessary resolution. There are two primary addressing schemes used with flat panel displays made from pixels arrayed into rows and columns: "active matrix" and "passive matrix". Both schemes involve addressing every pixel in the array once per "frame time". This requires providing excitation data (which determines whether the pixel is to be off or on, and in some cases its brightness level) to each pixel, which is typically accomplished by activating each row in turn from the top to the bottom of the array, and providing a data signal on each column line while a row is activated.

"Active matrix" addressing for an LCD display employs at least one transistor and a capacitor at each pixel site; a current conducted through the transistor charges the capacitor, which then maintains a drive signal to the pixel when the pixel's row is not being addressed. Having one transistor and one capacitor at every pixel site results in a very high transistor count, a high fabrication cost, and possible reliability problems. This problem is exacerbated with an OED-type display, which, because the pixels are current driven, requires the use of a controllable current source at every pixel site, each of which requires at least two transistors and a capacitor. This further increases transistor count, and thereby worsens the associated cost and reliability problems.

"Passive matrix" addressing employs no active components at each pixel site; instead, the drive electronics reside at the end of each row and column. Thus, a pixel is only excited while it is being addressed. An OED display employing passive matrix addressing thus has a greatly reduced component count, but because a row's pixels are not being excited while the other rows are being scanned, it is difficult to achieve a desired brightness level. There is an optimum voltage at which an OED pixel will operate efficiently. To increase the display's brightness, an OED pixel can be driven with a voltage greater than the optimum, but doing so dramatically reduces the display's energy efficiency and increases its heat output. If the display is battery-powered as on a laptop computer, for example, the inefficiency reduces the life of the battery, while the excess heat tends to shorten the lifetime of the OEDs.

SUMMARY OF THE INVENTION

An addressing scheme for use with current-driven emissive displays, and a fabrication scheme for use with all non-passive matrix displays, are presented which help to overcome the problems noted above. The addressing scheme provides performance superior to that provided by a passive matrix display, while requiring fewer components than are required by an active matrix display. A preferred fabrication scheme involves removing all active components from the pixel side of the display panel, serving to simplify display fabrication.

The addressing scheme requires that an array containing N rows and M columns of current-driven emissive display pixels be sub-divided into K segments, each of which consists of N/K rows and M columns. One controllable current driver is provided for each column of pixels within a segment, rather than for each pixel as with an active matrix. Each of the segments includes a respective gate address line, to which each of the segment's current drivers is connected; each current driver is also connected to a corresponding column address line. Each of the current drivers within a segment is arranged to provide a current level to its column of pixels which corresponds to the voltage on the current driver's corresponding column address line when the segment's gate address line is selected. A controller is arranged to control the gate address lines as needed to cause the current drivers to control each of the pixels in the array.

The addressing of each pixel preferably proceeds as follows: a frame time is divided into N/K "sub-frame" times. During the first sub-frame time, the first segment's current drivers are turned on and the first row of the first segment is addressed. The first rows of each of the remaining segments are addressed in turn during the remainder of the first sub-frame time. During the second sub-frame time, each of the second rows are addressed (one segment at a time), and the remaining rows are addressed in this manner during the remaining sub-frame times.

By segmenting and addressing the array in this way, the duty ratio required to drive the array is reduced by a factor of K when compared with a passive matrix display of the same size, and the number of transistors required to drive the array is reduced by a factor of N/K when compared with an active matrix display of the same size. These advantages are realized with arrays of any type of current-driven emissive pixel, such as OED pixels.

The present display can be implemented with the active components fabricated on the pixel side of the display panel. However, the fabrication of a current-driven emissive display, as well as other types of non-passive matrix displays, may be simplified by removing all active components from the pixel side of the display panel. Under this approach, the active components are placed either on the back side of the display panel or on a separate printed-circuit board (PCB). In the former case, the pixel array and drive electronics are formed on opposite sides of a multi-layer structure, with signals routed from the electronics to the pixel array directly through the structure. For the latter case, signals generated on the PCB are brought out to surface bonding pads on the board's back side, and connection points for the pixels are brought out to surface bonding pads on the back side of the display panel. The PCB and display are arranged such that, when brought together, their respective bonding pads contact each other and thereby provide the necessary interconnections between PCB and display. Fabrication may be further simplified by combining the current drivers and other drive electronics into application-specific integrated circuits (ASICs).

Further features and advantages of the invention will be apparent to those skilled in the art from the following detailed description, taken together with the accompanying drawings.

DETAILED DESCRIPTION OF THE INVENTION

Figure 1A:
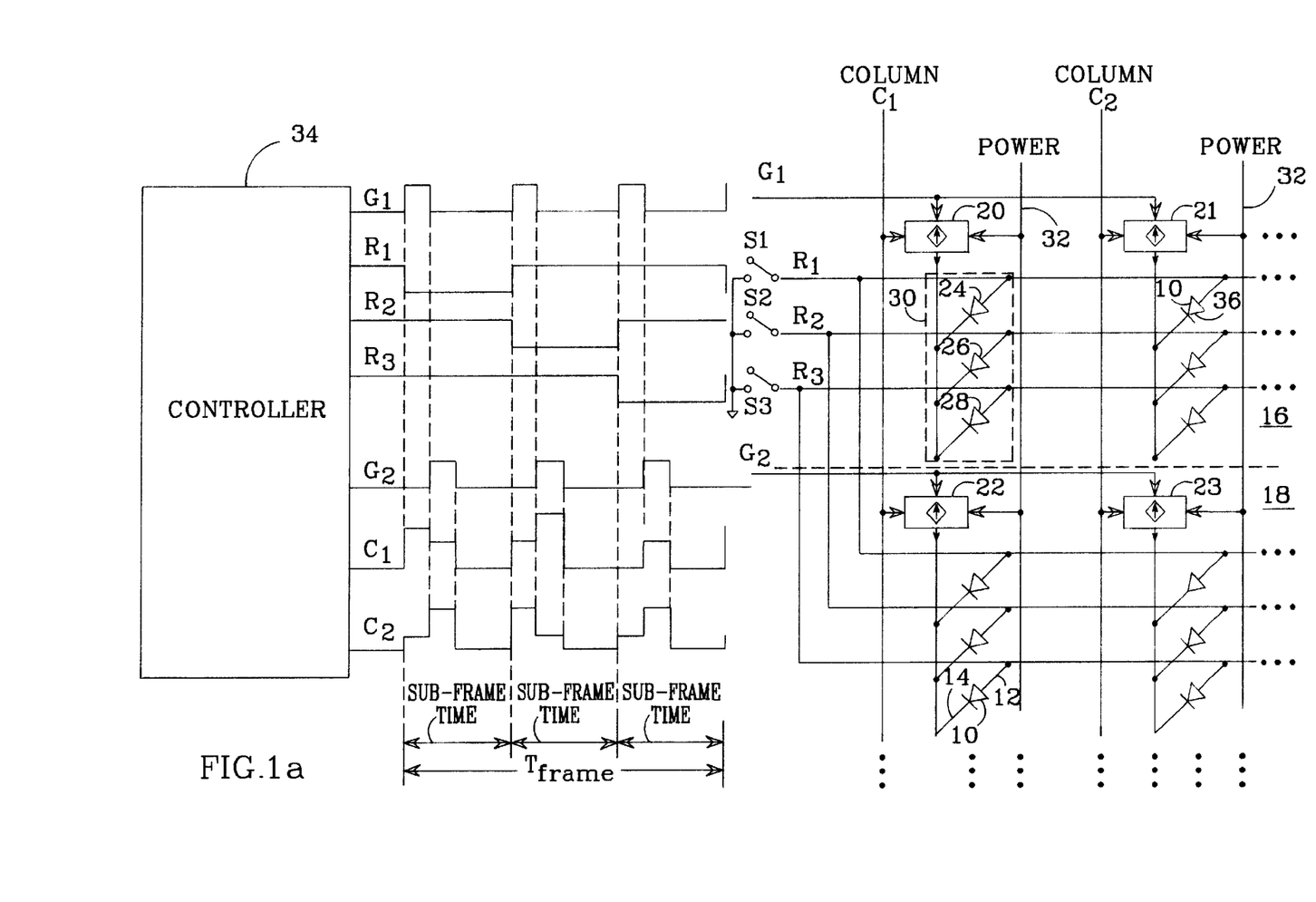
FIG. 1a is a block/schematic diagram of a current-driven emissive display segmented per the present invention, and an exemplary set of drive signal waveforms for addressing the display.

A exemplary current-driven emissive display per the present invention is shown in FIG. 1a. A six row by two column display is depicted for the purpose of illustrating the invention's principles, though an actual display would typically have many more rows and columns.

The display is made up of a number of current-driven emissive pixels 10, which are arranged into an array. A current-driven emissive pixel is any of a family of devices, such as organic emissive devices (OEDs), which respond nearly instantaneously to the current that flows through them, with the brightness produced varying directly with the current. In FIG. 1a, the devices are depicted as having an anode 12 and a cathode 14, and a positive forward voltage is required to illuminate the device.

Figure 2:
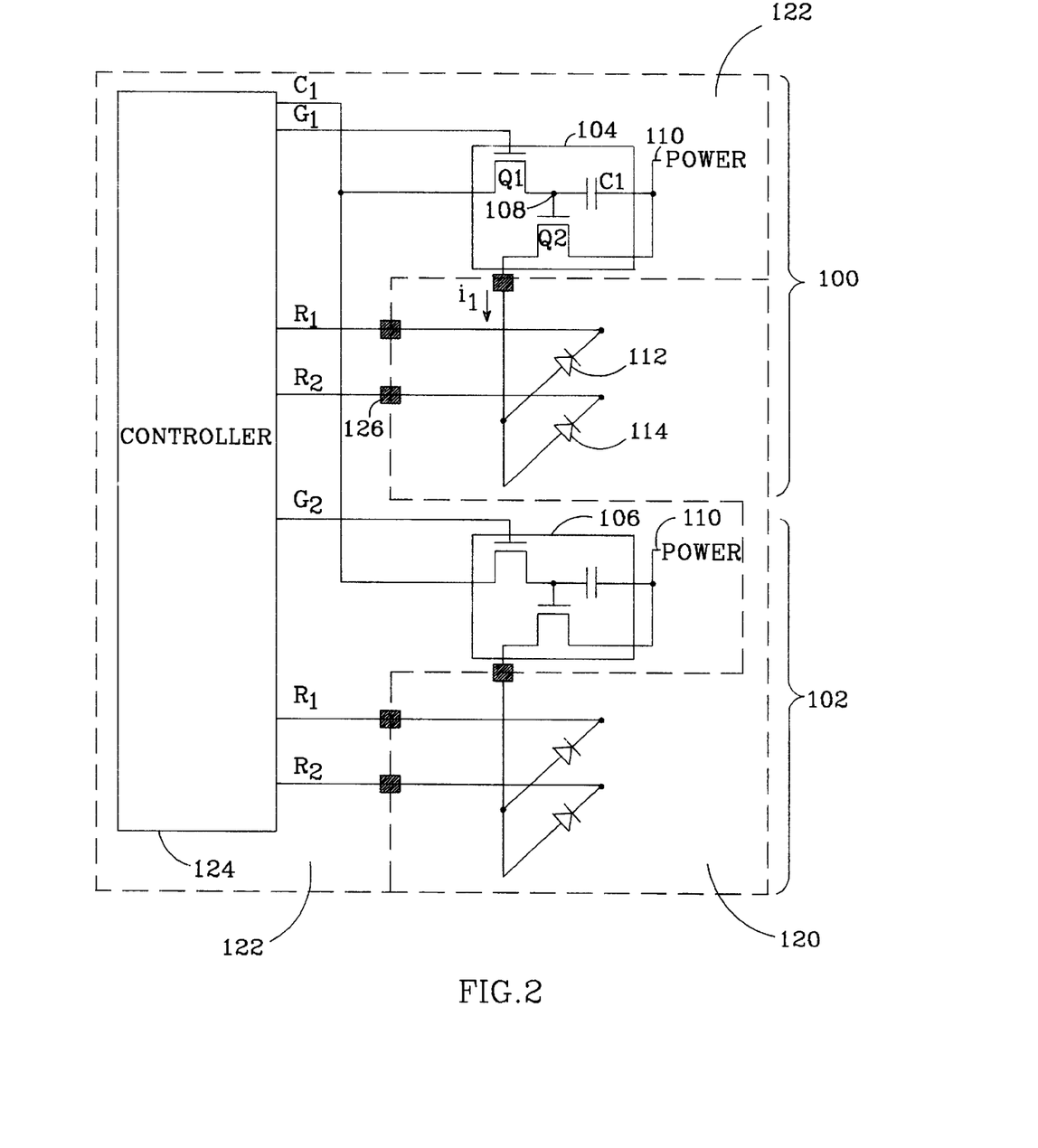
FIG. 2 is a more detailed block/schematic diagram of a current-driven emissive display segmented per the present invention, which also illustrates the separation of drive electronics and display pixels per the present invention.

Each row of pixels has a corresponding row address line, and each column of pixels has a corresponding column address line. In FIG. 1a, the anodes of the pixels in a given row are connected to its corresponding row address line. A given row of pixels is addressed by establishing a particular voltage on its row address line, referred to as "selecting" the row address line; the row address line is "deselected" when the voltage is removed. An individual pixel in the row is driven to conduct and thereby illuminate by applying a voltage to its cathode which makes the voltage across the device sufficiently positive. As configured in FIG. 1a, this requires making a pixel's cathode negative with respect to its row address line. Note that, depending on how the display is fabricated, it may be preferable to orient the pixels such that their cathodes are connected to the row lines, instead of their anodes as shown in FIG. 1a; the invention is equally applicable to this alternate configuration (which is illustrated in FIG. 2).

The invention differs from conventional displays in several respects. Rather than employ a continuous array of N identically-constituted rows, the present invention divides an array of N rows and M columns into K segments, each of which includes N/K rows and M columns. In the exemplary array shown in FIG. 1a, N=6 and K=2, such that the six row array is divided into two segments 16 and 18, each having N/K=3 rows. The row address lines for the N/K rows of a given segment are shared by the corresponding rows in each of the other segments; thus, the first, second, and third rows of pixels in segment 16 are connected to row address lines $R_1$, $R_2$, and $R_3$, respectively, as are the first, second, and third rows of pixels in segment 18.

In addition, rather than connecting each pixel in a column to its corresponding column address line, each column of each segment employs a corresponding transistor-controlled current driver 20, 21, 22, 23. The output of each current driver is connected to the cathodes of each pixel in its "column segment"; i.e., the N/K pixels contained in the current driver's corresponding column. In FIG. 1a, the output of transistor-controlled current driver 20 is connected to the cathodes of the three pixels 24, 26 and 28 found in its column segment 30. In an array of N rows and M columns which is divided into K segments, there are M current drivers in each segment, and a total of M×K current drivers in the array.

Each segment has an associated "gate address line", which is connected to each of its current drivers. As shown in FIG. 1a, gate address line $G_1$ is connected to current drivers 20 and 21 of segment 16, and gate address line $G_2$ is connected to current drivers 22 and 23 of segment 18. Each current driver is also connected to a column address line: current drivers 20 and 22 to column address line $C_1$, and current drivers 21 and 23 to column address line $C_2$. Each current driver 20–23 is typically connected to a power bus 32 as well. When the gate address line for a segment goes high (or low, depending on the configuration of the system), referred to herein as "selecting" the gate address line, the voltage level of the column address line connected to the segment's drivers is conveyed to the drivers. For example, selecting gate address line $G_1$ conveys the voltage on column address line $C_1$ to the current driver 20, and conveys the voltage on column address line $C_2$ to the current driver 21. Returning a gate address line to a "low" state "deselects" the line, and isolates its current drivers from the column address lines.

Arranging a current-driven emissive display as described above enables the display to be operated as essentially separate sub-displays. When such a display is properly addressed, both the duty ratio required to drive the array (when compared with a comparable passive matrix display) and the number of transistors required to implement the display (when compared with a comparable active matrix display) are reduced.

A preferred addressing sequence is illustrated with reference to the signal waveforms shown in FIG. 1a, which are generated by a controller 34. The addressing is arranged so that each pixel in the array is addressed once every "frame time" $T_{frame}$. In connection with the segmentation of the array as discussed above, a frame time is divided into "sub-frame times" of equal duration. That is, for an N-row array divided into K segments, a frame time is divided into N/K sub-frames, each having a duration $T_{sub}$ given by $T_{sub}=T_{frame}/(N/K)$. For the array shown in FIG. 1a, addressing is broken up into 6/2=3 sub-frame times, each having a duration $T_{sub}$ of $T_{frame}/3$.

During a given sub-frame time, a selected row in each segment is addressed. In FIG. 1a, for example, during the first sub-frame time, the first row of each segment is addressed. Similarly, during the second and third sub-frame times, the second and third rows, respectively, of each segment are addressed. As noted above, a row of pixels is addressed by selecting its row address line; this is typically accomplished by switching the row address line to ground. As illustrated in FIG. 1a, switches S1, S2, and S3 are connected to row address lines $R_1$, $R_2$, and $R_3$, respectively, with each row addressed by switching its respective address line to ground for the duration of its corresponding sub-frame time. FIG. 1a includes waveforms for row address lines $R_1$, $R_2$, and $R_3$, which, for illustrative purposes, are shown as toggling low when their corresponding switches are closed (i.e., when a row address line is selected) and toggling high when open (when the row address line is deselected). Note that the actual voltage on a row address line when its switch is open may, in fact, be lower than ground.

To enable each pixel to be addressed individually, the segments' transistor-controlled current drivers are activated sequentially. This is illustrated in FIG. 1a: during the first sub-frame time, gate address line $G_1$ is selected first, which turns on current drivers 20 and 21 in segment 16. With $G_1$ and $R_1$ selected, the only pixels in the array that can be addressed are the two pixels (24 and 36) connected to row address line $R_1$ in segment 16, which are addressed by their corresponding current drivers 20 and 21, respectively. $G_1$ is then deselected (isolating current drivers 20 and 21 from column address lines $C_1$ and $C_2$), and, while still in the first sub-frame time, line $G_2$ is selected, enabling current drivers 22 and 23 in segment 18 to be addressed. As explained in more detail below, current drivers 20 and 21 continue to excite their corresponding pixels throughout the first sub-frame time, despite the fact the $G_1$ is deselected.

Each of the transistor-controlled current drivers is connected to a corresponding column address line, from which it receives a voltage that indicates the current level to be provided to the addressed pixel. This is illustrated by reference to column address line waveforms $C_1$ and $C_2$ in FIG. 1a. With $G_1$ and $R_1$ selected, voltages are placed on column address lines $C_1$ and $C_2$. These voltages are received by current drivers 20 and 21, respectively, and the current drivers generate and deliver the currents indicated by the column voltages to pixels 24 and 36. Similarly, when $G_2$ and $R_1$ are selected, the voltages placed on column address lines $C_1$ and $C_2$ are converted by current drivers 22 and 23 into currents that are delivered to the two pixels in the first row of segment 18. For arrays having more than two segments, addressing continues in this fashion until the pixels in the first row of every segment have been addressed.

The same sequence of events takes place during the second sub-frame time, except that now the second row address line $R_2$ is selected, so that the pixels in the second row of every segment are addressed as the segments' respective gate address lines are selected in turn. Similarly, during the third sub-frame time, the pixels in the third row of every segment are addressed. In this way, each pixel of the array is individually addressed.

As described in detail below, the transistor-controlled current drivers are arranged such that they can be addressed in a small fraction of a sub-frame time. The display is preferably arranged so that each row of current drivers is quickly addressed in turn at the start of a sub-frame time. Thus, for the first sub-frame time, all of the pixels in the first row of every segment are excited for nearly all of the first sub-frame time. This is also true during subsequent sub-frame times for each of the other rows.

By addressing the array in this manner, the duty ratio required to drive the array is reduced by a factor of K when compared with a passive matrix current-driven emissive display of the same size, and the number of transistor-controlled current drivers required to drive the array is reduced by a factor of N/K when compared with an active matrix current-driven emissive display of the same size. Thus, a display per the present invention provides some of the advantages of both active and passive matrix displays: the reduced transistor count (when compared with an active matrix) brings the fabrication cost closer to that of a passive matrix, while the use of M×K (as opposed to M×N) transistor-controlled current drivers enables desired brightness levels to be attained nearly as efficiently as that provided by an active matrix. However, some compromise is required to obtain the benefits afforded by the invention: an active matrix display provides excitation to each pixel continuously, while for the display described herein, only one row from every segment (i.e., K rows) can be excited at any one sub-frame time.

Each of the transistor-controlled current drivers 20–23 include at least one transistor, a storage device, and a voltage-controlled current source. In operation, the transistor's current circuit is connected between the transistor-controlled current driver's column address line and the storage device. The transistor acts as switch: when closed in response to its gate address line going high (for an n-type transistor; the transistor is closed in response to a low-going gate address line if p-type), the voltage present on the column address line is conducted to the storage device, which stores the voltage. The voltage-controlled current source is connected to the storage device and provides a current to its N/K pixels in accordance with the voltage stored on the storage device.

Note that as used herein, a "transistor-controlled current driver" may operate as either a current source or a current sink, sourcing or sinking a current that varies in accordance with the voltage on its corresponding column address line. The transistor-controlled current drivers in FIG. 1a, for example, must act as current sinks, pulling the cathodes of their respective pixels below ground to illuminate each device. When so configured, the power bus 32 connected to the transistor-controlled current drivers must carry a negative voltage. If the transistor-controlled current drivers are configured to source current (as shown below in FIG. 2), power bus 32 carries a positive voltage.

Due to the storage devices, a segments' transistor-controlled current drivers need be addressed only briefly during a sub-frame time. Once a voltage has been conducted to the storage device, the voltage applied to the voltage-controlled current source—and thus the current provided to the addressed pixel—remains nearly constant throughout the remainder of the sub-frame time. For example, when transistor-controlled current driver 20 has been activated with gate address line $G_1$, and has conducted the voltage present on column address line $C_1$ to its storage device, pixel 24 will be driven by the output current of driver 20 until the next time $G_1$ is selected, which does not occur until the next sub-frame time.

As noted above, the use of storage devices permit the pulse widths of the gate address line and column address line signals to be much narrower than a sub-frame time (and typically much narrower than those shown in FIG. 1a, which are shown wider for illustrative purposes). This is desirable, as there would typically be many segments in a large pixel array which must be sequenced through in a given sub-frame time, necessitating that the data needed by each segment be conveyed very quickly. With the addressing time very short in comparison to a sub-frame time, each row of current drivers is preferably quickly addressed in turn at the start of a sub-frame time, so that all of the pixels in a given row of each segment are excited for nearly all of that row's sub-frame time.

Figure 1B:
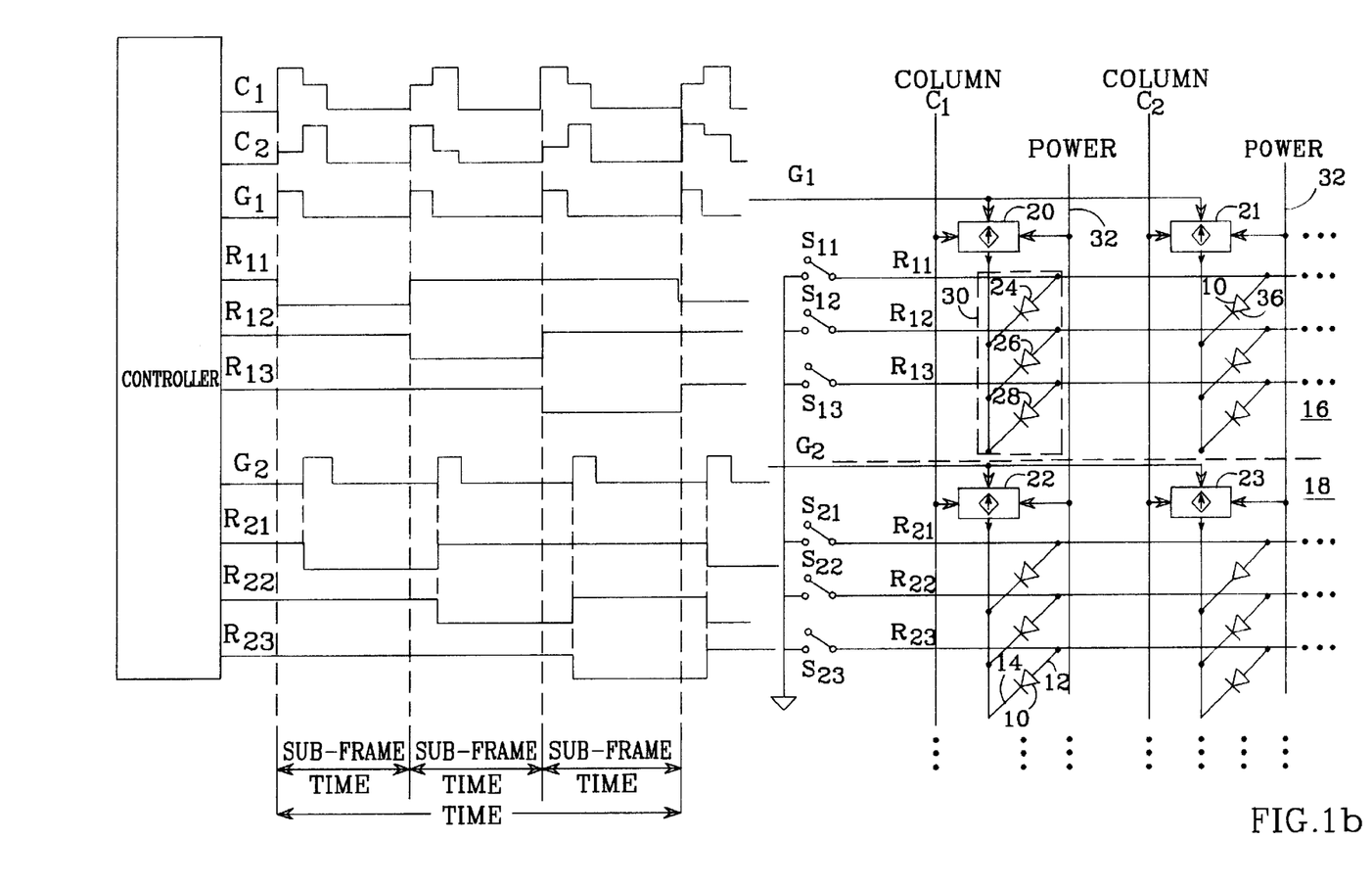
FIG. 1b is a block/schematic diagram of an alternative implementation of a current-driven emissive display segmented per the present invention, and an exemplary set of drive signal waveforms for addressing the display.

An alternative implementation of a current-driven emissive display per the present invention is shown in FIG. 1b. As in the previous example, the exemplary array has six rows (N=6), two columns (M=2), and is divided into two segments (K=2). This implementation differs from that shown in FIG. 1a in that here, there are N independent row address lines ($R_{11}$, $R_{12}$, $R_{13}$, $R_{21}$, $R_{22}$, and $R_{23}$, controlled by switches $S_{11}$, $S_{12}$, $S_{13}$, $S_{21}$, $S_{22}$, and $S_{23}$, respectively), whereas in FIG. 1a, there are only N/K row address lines, each of which is routed to one row in each of the K segments.

Making each of the row address lines independent allows the gate address line pulses to be wider than they were in FIG. 1a, while still enabling each row to be excited for an entire sub-frame time. This is illustrated with reference to the signal waveforms shown in FIG. 1b. A frame time $T_{frame}$ is still divided into N/K=3 sub-frames, each having a duration $T_{sub}$ of $T_{frame}/3$. At the start of the first sub-frame, gate address line $G_1$ is selected, which addresses transistor-controlled current drivers 20 and 21 in segment 16 and enables the drivers' current levels to be set with the voltage present on column address lines $C_1$ and $C_2$, respectively. Row address line $R_{11}$ is also selected at the start of the first sub-frame, and remains selected until the end of the sub-frame. In this way, row $R_{11}$ is excited by current drivers 20 and 21 for essentially all of the first sub-frame time.

When $G_1$ is deselected, and while still in the first sub-frame, gate address line $G_2$ is selected, addressing current drivers 22 and 23 in segment 18 and setting their current levels. When $G_2$ is selected, row address line $R_{21}$ is also selected, and $R_{21}$ remains selected for a time equal to $T_{sub}$. However, because $R_{21}$ was not selected at the beginning of the first sub-frame, it will not be deselected at the end of the first sub-frame; rather, $R_{21}$ stays selected into the start of the second sub-frame time before finally being deselected.

In the embodiment of FIG. 1a, the row address lines are shared by each segment; as such, the length of time each row address line can be selected is confined to a particular sub-frame time. When so configured, exciting each row for as much of a sub-frame time as possible requires making the gate address pulses as short as possible. But when the row address lines are independent as in FIG. 1b, the selection of the row address lines can be evenly staggered throughout a sub-frame, with all but one row address line ($R_{11}$ in FIG. 1b) being deselected during the subsequent sub-frame. This addressing scheme enables each row to be excited for a time equal to $T_{sub}$, without requiring very short gate pulses. In fact, under this approach, a gate address line's pulse width $T_{gate}$ can be as wide as $T_{gate}=T_{sub}/K$. Using the addressing scheme depicted in FIG. 1a, $T_{gate}$ must be much shorter than $T_{sub}/K$ to obtain similar results.

While the addressing scheme of FIG. 1b provides the benefits noted above, it also has disadvantages. For the FIG. 1a case, there are only N/K row address lines, whereas here there are N row address lines. The increased number of row address lines results in more electrical connections that must be made at the edge of the array, as well as additional drive electronics to drive the additional lines.

A more detailed diagram of an array per the present invention is shown in FIG. 2. The array has four rows and one column, and is divided into two two-row segments 100 and 102. The segments 100 and 102 include respective transistor-controlled current drivers 104 and 106, which are shown in a preferred implementation in FIG. 2. Transistor-controlled current driver 104, for example, includes a first transistor Q1, a capacitor C1, and a second transistor Q2. Q1, C1 and Q2 serve as the transistor-controlled current driver's switching transistor, storage device, and voltage-controlled current source, respectively. One side of Q1's current circuit is connected to column address line $C_1$, and the other side is connected to capacitor C1 at a junction 108. Junction 108 is also connected to the control input of transistor Q2, which is connected between a power bus 110 and the pixels 112, 114 it is assigned to drive.

When gate address line $G_1$ goes high ($G_1$ selected), Q1 conducts the voltage present on column address line $C_1$ to capacitor C1, which stores the voltage. Once the voltage is stored, gate address line $G_1$ can go low ($G_1$ deselected), with capacitor C1 maintaining the voltage at junction 108 nearly constant. With the control input of Q2 connected to junction 108, the voltage at junction 108 determines the amount of current $i_1$ that Q2 conducts from power bus 110 to pixels 112 and 114. Current $i_1$ will be delivered to pixels 112 and 114 until $G_1$ is selected again and a new $C_1$ voltage is stored on C1. If row address line $R_1$ is low ($R_1$ selected) while $i_1$ is available, pixel 112 will illuminate, with a brightness determined by the magnitude of $i_1$. Pixel 114 is similarly illuminated when row address line $R_2$ is selected.

Note that the pixels shown in FIG. 2 are oriented in the opposite direction from those in FIG. 1a, with the pixels' anodes connected to corresponding row address lines, and their cathodes connected to the current drivers. Current drivers 104 and 106 are configured to source current to their corresponding pixels, and thus power bus 110 would typically carry a positive voltage.

The transistor-controlled current driver implementation shown in FIG. 2 is merely exemplary; many other circuit configurations are possible. The implementation shown is preferred for its simplicity; other configurations may perform better.

FIG. 2 also illustrates a preferred fabrication scheme for the current-driven emissive display, which can also be used with other types of "non-passive" matrix displays—i.e., row and column displays for which at least some active components are required within the array. Though the active components could be fabricated on the pixel side of the display panel in the manner of a conventional active-matrix display, the preferred scheme requires that a display's active components be built off of the pixel side of the display panel. As illustrated in FIG. 2, the display is separated into a pixel array portion 120, and a drive electronics portion 122, which contains the transistor-controlled current drivers 104, 106. Drive electronics portion 122 may also contain additional drive circuitry, such as a controller 124 which generates the display's row, column, and gate address line signals. With the drive electronics separated from the pixel array, a means of interconnecting the distinct portions must be provided. The points at which interconnections must be made between pixel array 120 and drive electronics portion 122 are indicated as black squares 126 in FIG. 2.

With a conventional active matrix display, the transistors required at each pixel are typically fabricated on the display panel's glass substrate with the pixels. Removing all drive components from the pixel array greatly simplifies the task of fabricating the display.

Figure 3:
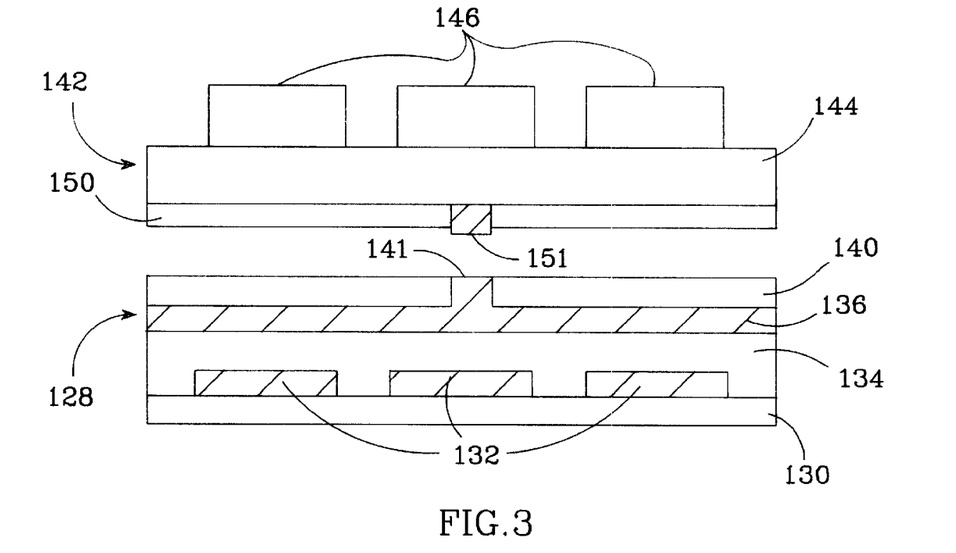
FIG. 3 is a sectional view of an embodiment of a flat panel display fabricated per the present invention in which the drive electronics and the pixels are mounted on separate substrates.

A number of techniques can be used to accommodate the active components. For example, the active components could be mounted on the back side of the display panel, as discussed in more detail below. Another possible approach is illustrated in FIG. 3. The pixel array portion 120 of a display is assembled into a display panel 128, which, for an organic emissive display, typically comprises a transparent substrate 130, row electrodes 132, an organic layer 134, and a column electrode 136. The pixel array's interconnection points are brought to the surface of the back side of the display panel as "surface bonding pads" which are physically and electrically isolated from each other with an insulation layer 140. Surface bonding pads are metal pads that are distributed in known locations on the surface of the back side of the panel, an example of which is shown in FIG. 3 as pad 141.

The drive electronics portion 122 is assembled on a printed-circuit board (PCB) 142, which typically includes a board 144 containing the drive electronics 146. The drive electronics' interconnection points are brought to the board's surface on the side of board 144 opposite the drive electronics as surface bonding pads which are physically and electrically isolated from each other with an insulation layer 150, and example of which is pad 151 in FIG. 3. The back sides of display panel 128 and PCB 142 are designed to be brought together, with their respective surface bonding pads 141, 151 aligned to contact each other to make the necessary interconnections.

Using surface bonding pads as described above facilitates the high density interconnections between the display panel and the PCB. Conventional edge bonding could also be employed, though this requires that a large number of interconnection leads be arranged side-by-side at the edges of the display. The necessarily thin leads resulting from this technique can be fragile or may come into contact with each other, thereby degrading the display's reliability.

The described fabrication scheme requires: 1) that the PCB and the display panel exhibit a certain degree of dimensional stability (dependent, for example, on desired resolution and panel size), and 2) the ability to align the two structures accurately. The fabrication technique is preferred for displays that are divided into segments as described above, due to the reduction in the number of required interconnections afforded by the segmentation. However, at its limit, the scheme can be applied to hybridized active-matrix displays, for which each pixel is connected to an individual transistor circuit built on a separate substrate. As noted above, the scheme is not limited to segmented current-driven emissive displays; rather, it is applicable to any row and column display that requires at least some active components.

Figure 4A:
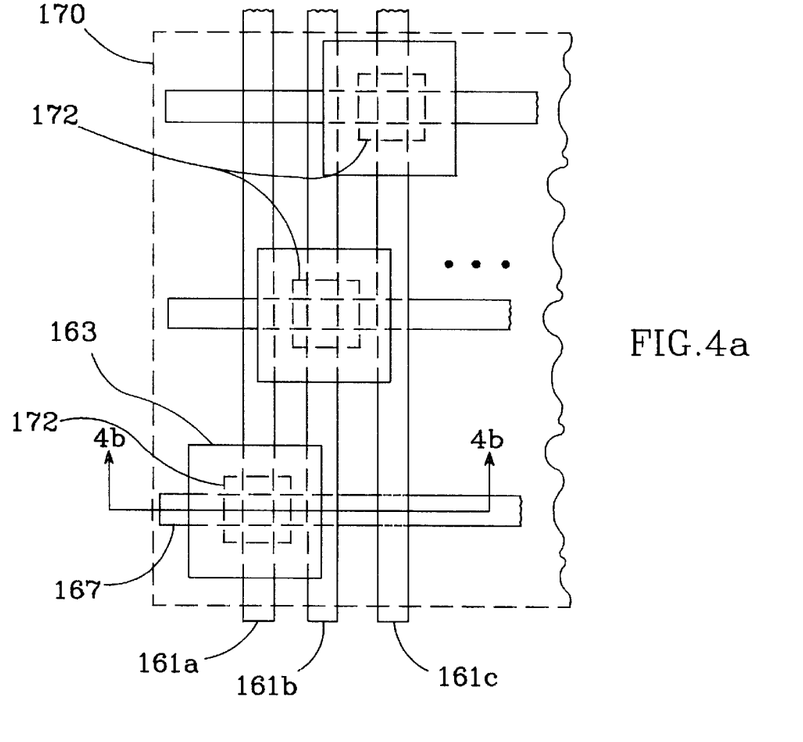
FIGS. 4a and 4b are plan and cross-sectional views, respectively, of another embodiment of a flat display panel fabricated per the present invention in which the drive electronics and the pixels are mounted on separate substrates.
Figure 4B:
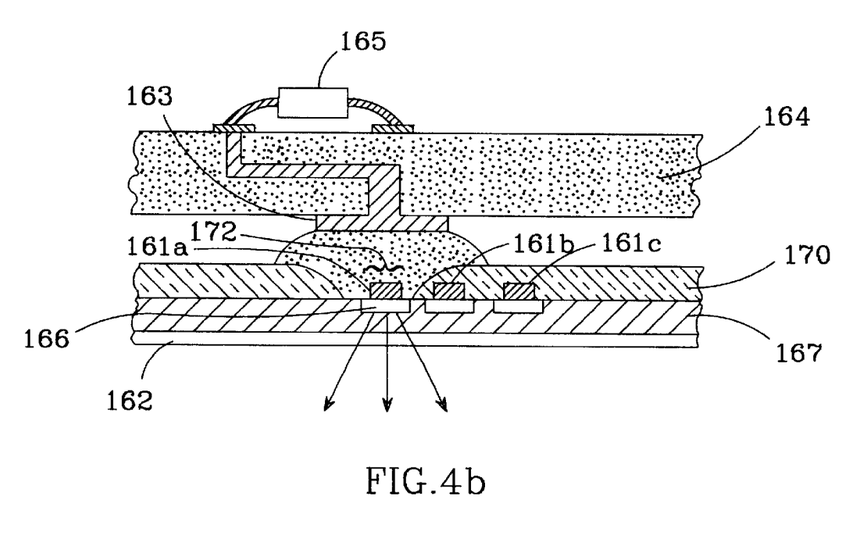

The need to accurately align the PCB and display panel to effect their interconnection can be somewhat relaxed by employing a technique illustrated in the plan and corresponding cross-sectional views shown in FIGS. 4a and 4b, respectively. A number of column electrodes 161a, 161b, and 161c are arrayed side-by-side on the surface of a transparent substrate 162. A surface bonding pad 163 which is to make electrical contact with column electrode 161a is located on a separate PCB substrate 164 containing drive electronics 165. An organic material 166 and a row electrode 167 are disposed between column electrode 161a and substrate 162 to form a pixel (substrates 162 and 164 and organic material 166 are not shown in FIG. 4a for clarity). Substrate 162 preferably provides a hermetic seal over organic material 166, so as to prevent oxygen or moisture from permeating through the substrate and compromising the organic material. Note that in FIG. 4b, the size of the gap between PCB substrate 164 and the pixel array is exaggerated for clarity.

A patterned insulator layer 170 is employed between the column electrodes and the PCB surface bonding pad 163. The insulator layer is patterned such that openings 172 are provided in layer 170 where each PCB bonding pad is to make electrical contact with a column electrode. In addition to providing well-defined access points for the column electrodes, insulator layer 170 also serves to ensure that the PCB bonding pads contact only their respective electrodes and no more, by providing an insulating layer around each opening. Thus, if PCB bonding pad 163 is slightly misaligned with respect to electrode 161a, the insulating properties of layer 170 prevent pad 163 from contacting any of the adjacent electrodes. As shown in FIG. 4a, the interconnection points for the column electrodes are preferably staggered, to provide the greatest possible protection against misalignment.

A conductive adhesive (or solder) 174 is applied in openings 172, to ensure electrical contact between the PCB bonding pads and their respective column electrodes, and to physically bind the PCB substrate to the display panel substrate.

Figure 5:
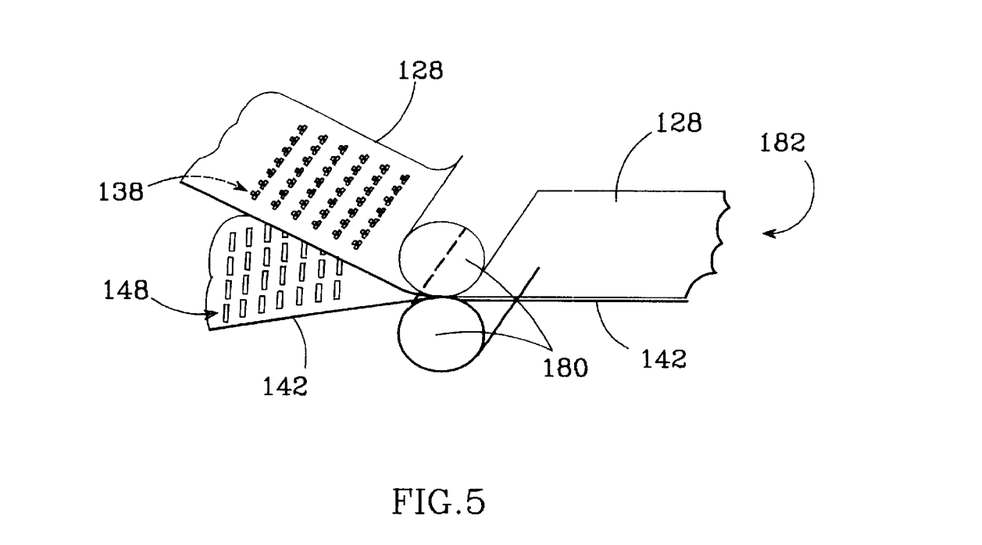
FIG. 5 is an illustration of how separate drive electronics and pixel substrates fabricated per the present invention might be joined.

FIG. 5 illustrates one method by which the display panel 128 and the PCB 142 can be brought together, using a roll-to-roll lamination process. Both display panel 128 and PCB 142 are fabricated on a flexible surface. The back side of panel 128 contains surface bonding pads 138, and the back side of PCB 142 has matching surface bonding pads 148. The panel and the PCB are aligned so that their respective surface bonding pads contact each other, and then passed through a pair of lamination rollers 180. This binds panel 128 to PCB 142 to form a complete current-driven emissive display 182.

Referring back to FIG. 3, the active components required to drive a display are preferably provided by one or more application specific integrated circuits (ASICs) 146. For a current-driven emissive display, for example, each ASIC 146 might contain a number of transistor-controlled current drivers. This reduces the number of chips and/or discrete components that need to be on the PCB, further simplifying the display fabrication process. Additional drive electronics, including the circuitry of the controller which generates the necessary addressing waveforms, could also be housed within one or more ASICs.

Figure 6:
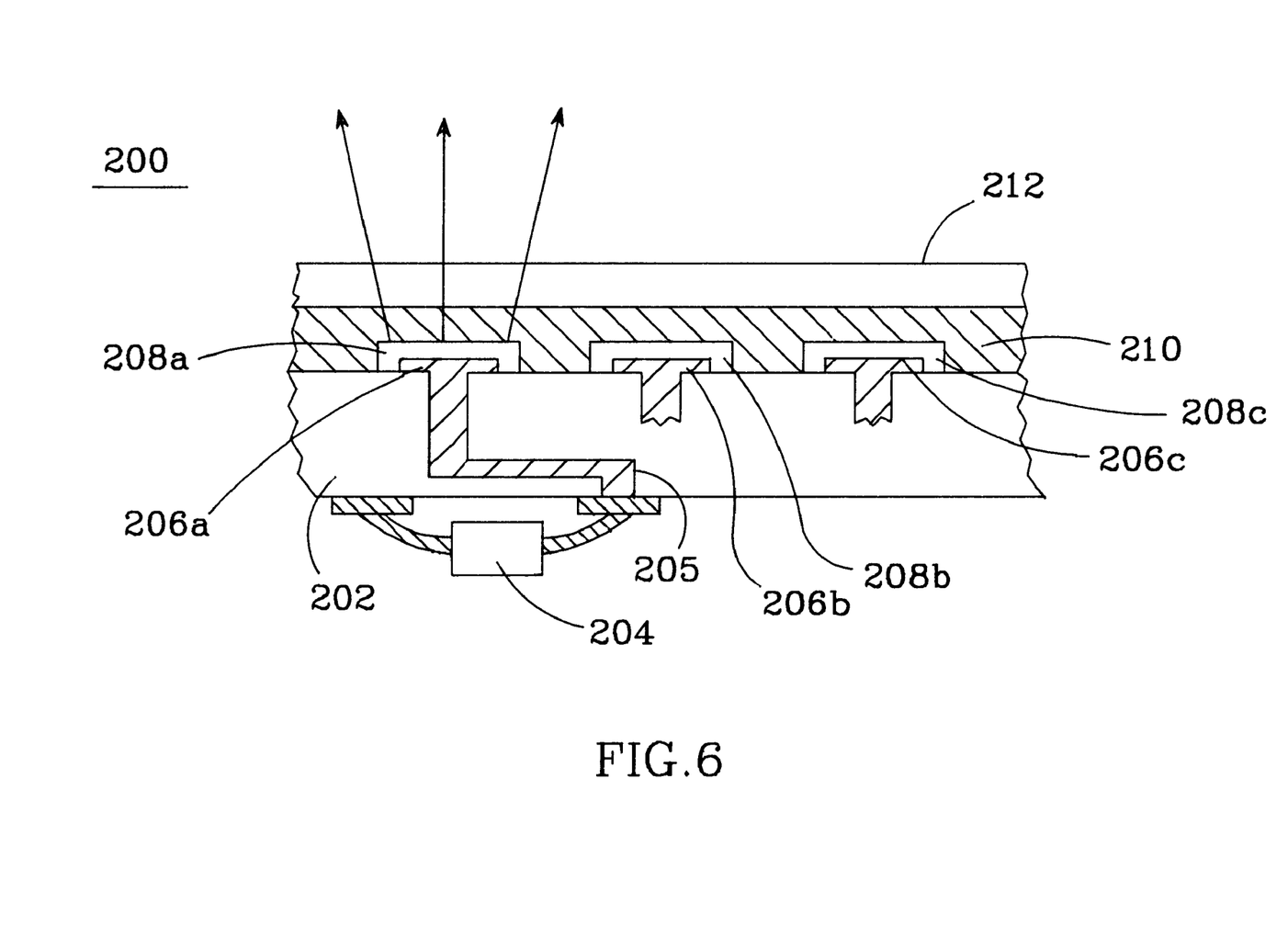
FIG. 6 is a sectional view of an alternative implementation of a flat panel display fabricated per the present invention in which the drive electronics and the pixels are mounted on opposite sides of a multi-layer structure.

A sectional view of an alternative implementation of a flat panel display fabricated per the present invention is shown in FIG. 6. In this embodiment, the active components and the pixel array are formed together into a multi-layer structure 200. Rather that locating the active components on a separate substrate and then bringing the display panel and printed circuit substrates together, multi-layer structure 200 includes both the pixel array and the active components. A layer 202 supports the active components 204; layer 202 includes conductive paths 205 which route electrical signals from the active components through the layer to the pixel array. The display portion of the structure includes column electrodes 206a, 206b and 206c located on the surface of layer 202, with the organic materials 208a, 208b and 208c of a row of pixels disposed between a row electrode 210 and respective column electrodes. A transparent glass or plastic top layer 212 of structure 200 serves as a protection layer which can be either coated or laminated onto the structure.

Light is emitted when a current is passed through a pixel's organic material. To enable the light to escape from the structure, row electrode 210 and layer 212 must be substantially transparent. Transparent electrode 210 can be made from, for example, indium tin oxide (ITO), doped zinc oxide, or very thin metal. Layers 202 and 212 preferably have a low permeability, hermetically sealing the device to prevent oxygen and moisture from reaching the organic material 208a, 208b and 208c.

Conductive paths 205 between the active components and the display panel electrodes are routed through layer 202 in the manner of a conventional PCB. These conductive paths can be provided in a number of ways. For example, vias can be drilled through layer 202, either mechanically or with a laser, or vias can be chemically etched through the layer.

The architecture shown in FIG. 6 is not limited to a current-driven emissive display. Rather, it is usable with any non-passive matrix flat panel emissive display, as well as an LCD (non-emissive) display operated in the reflective mode.

The techniques of removing the active components from the pixel side of an array, and of employing a segmented addressing scheme as described above, enable the production of displays that are larger than present full active matrix current-driven displays. Conventional displays have their pixels and active components fabricated on the same side of a common substrate. To insure the compatibility of the pixel and transistor process steps, these displays typically employ transistors made from amorphous silicon. Unfortunately, this type of transistor must be fairly large to produce the current needed for a current-driven emissive display.

Separating the active components from the pixel side of the array removes all size and processing restrictions on the drive electronics, and allows the array to be virtually any desired size. Similarly, segmenting the display as described above significantly reduces both the number of active components and the number of interconnections needed for a display, further reducing the number of limitations to which a display might be subjected.

While particular embodiments of the invention have been shown and described, numerous variations and alternate embodiments will occur to those skilled in the art. Accordingly, it is intended that the invention be limited only in terms of the appended claims.

We claim:

1. A current-driven emissive display, comprising:
   an array of current-driven emissive display pixels arranged into N rows and M columns, each of said pixels having a brightness which varies directly with its drive current, said array of pixels sub-divided into K segments, each of said K segments consisting of N/K rows and M columns, each of said M columns having respective column address lines,
   K×M transistor-controlled current drivers, each of said current drivers connected to a corresponding one of said column address lines, the pixels in each column of each segment connected to a respective one of said current drivers, each of said current drivers connected to drive the N/K pixels found in its respective column segment, each of said segments having a respective gate address line which is connected to each of the current drivers within the segment, each of the current drivers within a segment arranged to provide a current level to its column of pixels which corresponds to the voltage present on the current driver's corresponding column address line when the segment's gate address line is selected,
   each of said transistor-controlled current drivers comprising:
      a first transistor,
      a storage device, and
      a voltage-controlled current source, said first transistor connected to conduct a voltage to said storage device in response to the selection of the transistor-controlled current driver's gate address line, said storage device storing said voltage, said voltage-controlled current source connected to provide said current level to its N/K pixels in accordance with the voltage stored on said storage device, and
   a controller arranged to control said gate address lines such that each of the pixels in said array is controlled via said transistor-controlled current drivers.

2. The emissive display of claim 1, wherein each of the current drivers within a segment is arranged to provide said current level by sinking an amount of current from its column of pixels which corresponds to the voltage present on the current driver's corresponding column address line when the segment's gate address line is selected.

3. The emissive display of claim 1, wherein each of the current drivers within a segment is arranged to provide said current level by sourcing an amount of current to its column of pixels which corresponds to the voltage present on the current driver's corresponding column address line when the segment's gate address line is selected.

4. The emissive display of claim 1, wherein said controller is arranged to address each of the pixels in said array during a time $T_{frame}$, said time $T_{frame}$ divided into N/K sub-frame times each having a duration $T_{sub}$ given by $T_{frame}/(N/K)$, said controller during a sub-frame time addressing a selected row within each segment segment-by-segment until the selected row in each of said segments has been addressed, said controller selecting and addressing a different row within each segment during each subsequent sub-frame time until each of the pixels in said array have been addressed,
   said segmentation and addressing scheme reducing the duty ratio required to drive the array by a factor of K when compared with a passive matrix current-driven emissive display of the same size, and reducing the number of transistors required to drive the array by a factor of N/K when compared with an active matrix current-driven emissive display of the same size.

5. The emissive display of claim 1, wherein said current-driven emissive display pixels comprise organic emissive devices (OEDs).

6. The emissive display of claim 1, wherein each of said storage devices comprises a capacitor connected to said first transistor at a first junction, said first transistor connected to said transistor-controlled current driver's respective gate address line and conducting a voltage from said transistor-controlled current driver's respective column line to said capacitor when said gate address line is selected, said capacitor connected to maintain said voltage at said first junction, and each of said voltage-controlled current sources comprises a second transistor connected to said first junction and conducting said current level between a power bus and the N/K pixels in said current driver's column segment in accordance with the voltage at said first junction.

7. The emissive display of claim 1, wherein said display comprises a display panel which contains said array of current-driven emissive display pixels and a printed circuit board (PCB) which contains said K×M transistor-controlled current drivers, said PCB interconnected to said display panel to form said current-driven emissive display.

8. The emissive display of claim 7, wherein said transistor-controlled current drivers are contained within one or more application-specific integrated circuits (ASICs).

9. The emissive display of claim 7, wherein said display panel includes surface bonding pads by which said pixels can be driven which are accessible from the back side of the display panel and said PCB includes a plurality of surface bonding pads on the side of said PCB opposite said transistor-controlled current drivers, said PCB and said display panel brought together such that their respective surface bonding pads contact each other to effect the interconnections necessary to form said current-driven emissive display.

10. The emissive display of claim 9, wherein said display panel further comprises a patterned insulator layer over said display panel's surface bonding pads, said insulator layer patterned to electrically isolate said display panel's surface bonding pads from each other and to provide openings above each of said display panel's surface bonding pads which enable the corresponding bonding pads of said display panel and said PCB to make electrical contact with each other.

11. The emissive display of claim 10, further comprising a conductive adhesive applied in each of said openings to bind said display panel to said PCB and to ensure that a conductive path exists between each PCB surface bonding pad and its corresponding display panel surface bonding pad.

12. The emissive display of claim 9, wherein said PCB and said display panel are brought together using roll-to-roll lamination.

13. The emissive display of claim 9, wherein said PCB and said display panel are fabricated on flexible substrates.

14. The emissive display of claim 1, wherein said display comprises a display panel having said pixel array fabricated on one side and said K×M transistor-controlled current drivers mounted on the side of said display panel opposite said pixel array, said current drivers interconnected to said pixel array to form said current-driven emissive display.

15. The emissive display of claim 14, wherein said display comprises:
a substrate, said K×M transistor-controlled current drivers mounted on one side of said substrate,
a first set of electrodes on said substrate, said first set of electrodes connected to said K×M transistor-controlled current drivers through said substrate,
a second set of electrodes,
a material disposed between said first and second sets of electrodes which with said electrodes forms pixels, said material when driven with a current emitting light, and
a substantially transparent protective layer on said pixels, light produced by said pixels emitted from said display through said protective layer.

16. The emissive display of claim 15 wherein said substrate and said protective layer hermetically seal the display from moisture and oxygen.

17. The emissive display of claim 1, wherein said array has N/K row address lines, each of which is connected to a corresponding row of pixels in each of said segments, the pixels in each column of each segment connected between a row address line and a respective one of said current drivers.

18. The emissive display of claim 17, wherein said controller is arranged to address each of the pixels in said array during a time $T_{frame}$, said time $T_{frame}$ divided into N/K sub-frame times each having a duration $T_{sub}$ given by $T_{frame}/(N/K)$, said controller during a sub-frame time addressing a selected row within each segment segment-by-segment until the selected row in each of said segments has been addressed, said controller selecting and addressing a different row within each segment during each subsequent sub-frame time until each of the pixels in said array have been addressed, said controller arranged to select each of said gate address lines in sequence at the start of each of said sub-frame times, the duration $T_{gate}$ for which each of said gate address lines is selected being much less than $T_{sub}/K$ such that each of said current drivers provides its programmed current level for nearly all of a sub-frame time.

19. The emissive display of claim 1, wherein said array has N row address lines, each of which is connected to a respective one of said rows of pixels, the pixels in each column of each segment connected between the pixel's row address line and a respective one of said current drivers.

20. The emissive display of claim 19, wherein said controller is arranged to address each of the pixels in said array during a time $T_{frame}$, said time $T_{frame}$ divided into N/K sub-frame times each having a duration $T_{sub}$ given by $T_{frame}/(N/K)$, said controller during a sub-frame time addressing a given row within each segment segment-by-segment until the given row in each of said segments has been addressed, said given rows addressed by selecting their respective row address lines, the selection of the given rows' row address lines being staggered evenly throughout said sub-frame time, each of the given rows' row address lines being selected for a time equal to a sub-frame time $T_{sub}$, said controller selecting and addressing a different row within each segment during each subsequent sub-frame time until each of the pixels in said array have been addressed, said controller arranged to select each of said gate address lines in sequence during each of said sub-frame times, the duration $T_{gate}$ for which each of said gate address lines is selected being equal to $T_{sub}/K$.

* * * * *